(12) United States Patent
Yoon

(10) Patent No.: US 6,901,646 B2
(45) Date of Patent: Jun. 7, 2005

(54) UNIVERSAL SNAP-FIT SPACER

(75) Inventor: Woong K. Yoon, Westminster, CO (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 10/052,160

(22) Filed: Jan. 16, 2002

(65) Prior Publication Data

US 2003/0131465 A1 Jul. 17, 2003

(51) Int. Cl.[7] .......................... B23P 11/02; H01R 12/00; H05K 1/00
(52) U.S. Cl. .............................. 29/453; 29/450; 29/469; 174/138 D; 403/9; 403/24; 403/345; 403/349; 24/453; 361/807; 361/809; 439/74
(58) Field of Search ........................... 29/453, 450, 469, 29/830, 831, 837, 428; 403/2, 6, 9, 24, 345, 349; 174/138 D; 439/74–82, 290–295, 284, 825–827, 844, 853; 361/807–809; 24/453, 297

(56) References Cited

U.S. PATENT DOCUMENTS

| | | | | |
|---|---|---|---|---|
| 2,155,584 A | * | 4/1939 | Bryant et al. ................ 474/231 |
| 2,267,126 A | * | 12/1941 | Moretti .................. 242/118.61 |
| 2,442,754 A | * | 6/1948 | Beam ......................... 248/27.1 |
| 2,855,206 A | * | 10/1958 | Haviland ................... 279/46.7 |
| 3,688,635 A | * | 9/1972 | Fegen ..................... 174/138 A |
| 3,733,655 A | * | 5/1973 | Kolibar ................... 403/408.1 |
| 3,764,729 A | * | 10/1973 | Kowalewski ........... 174/138 D |
| 3,777,052 A | * | 12/1973 | Fegen ..................... 174/138 D |
| 3,811,154 A | * | 5/1974 | Lindeman et al. ............. 24/326 |
| 3,836,703 A | * | 9/1974 | Coules ................... 174/138 D |
| 4,012,155 A | * | 3/1977 | Morris ....................... 403/290 |
| 4,149,764 A | * | 4/1979 | Mattingly, Jr. ................ 439/75 |
| 4,200,900 A | * | 4/1980 | McGeorge ................. 361/803 |
| 4,363,530 A | * | 12/1982 | Verhoeven ................. 439/557 |
| 4,427,316 A | * | 1/1984 | Moore et al. .................. 403/2 |
| 4,495,380 A | * | 1/1985 | Ryan et al. ............. 174/138 D |
| 4,495,548 A | * | 1/1985 | Matsui ........................ 361/790 |
| 4,502,193 A | * | 3/1985 | Harmon et al. ............... 24/621 |
| 4,544,217 A | * | 10/1985 | Denny ......................... 439/64 |
| 4,627,760 A | * | 12/1986 | Yagi et al. .................. 403/201 |
| 4,640,639 A | * | 2/1987 | Matsui ........................ 403/24 |
| 4,664,458 A | * | 5/1987 | Worth ......................... 439/82 |
| D290,929 S | * | 7/1987 | Hill ............................. D8/354 |
| D291,278 S | * | 8/1987 | Hill ............................. D8/354 |
| D295,369 S | * | 4/1988 | Niwa .......................... D8/354 |
| 4,776,811 A | * | 10/1988 | Humphrey ................. 439/378 |
| 4,786,225 A | * | 11/1988 | Poe et al. ..................... 411/32 |
| 4,797,113 A | * | 1/1989 | Lambert ...................... 439/74 |
| 4,875,140 A | * | 10/1989 | Delpech et al. ............. 361/789 |
| 4,903,603 A | * | 2/1990 | Longerich et al. .......... 102/293 |
| 4,938,703 A | * | 7/1990 | Nakano ....................... 439/74 |
| 4,969,065 A | * | 11/1990 | Petri ........................... 361/804 |
| 4,970,761 A | * | 11/1990 | Nakamura ................... 24/453 |
| 5,014,419 A | * | 5/1991 | Cray et al. .................... 29/830 |
| 5,018,982 A | * | 5/1991 | Speraw et al. ................ 439/74 |

(Continued)

FOREIGN PATENT DOCUMENTS

| | | | | |
|---|---|---|---|---|
| EP | 292892 A1 | * | 11/1988 | ........... A44B/17/00 |
| EP | 0 611 002 A1 | * | 8/1994 | ........... F16B/12/10 |
| GB | 2 032 202 A | * | 4/1980 | ........... H01R/13/33 |

Primary Examiner—Essama Omgba
(74) Attorney, Agent, or Firm—Sheridan Ross P.C.

(57) ABSTRACT

A universal snap-fit system for interconnecting multiple circuit boards in a stacked relationship is provided. The system allows circuit boards to be stacked with a minimum of assembly time. In addition, the system allows circuit boards of varying thicknesses to be stacked, without requiring the provision of system components in a multitude of sizes. The provided system also allows more than two circuit boards to be interconnected to one another in a stacked relationship without requiring multiple sets of attachment holes in interior circuit boards. In addition, more than two circuit boards can be stacked quickly and easily.

21 Claims, 7 Drawing Sheets

U.S. PATENT DOCUMENTS

| | | | |
|---|---|---|---|
| 5,106,310 A | * 4/1992 | Krajewski et al. | 439/75 |
| 5,112,232 A | * 5/1992 | Cray et al. | 439/75 |
| 5,129,830 A | * 7/1992 | Krajewski et al. | 439/75 |
| 5,135,403 A | * 8/1992 | Rinaldi | 439/82 |
| 5,147,227 A | * 9/1992 | Yurko | 439/733.1 |
| 5,152,696 A | * 10/1992 | Krajewski et al. | 439/75 |
| 5,254,016 A | * 10/1993 | Ganthier | 439/567 |
| 5,266,912 A | * 11/1993 | Kledzik | 333/247 |
| 5,316,487 A | * 5/1994 | Clark | 439/78 |
| 5,411,400 A | * 5/1995 | Subrahmanyan et al. | 439/68 |
| 5,548,486 A | * 8/1996 | Kman et al. | 361/791 |
| 5,715,595 A | * 2/1998 | Kman et al. | 29/845 |
| 5,754,412 A | * 5/1998 | Clavin | 361/804 |
| 5,878,483 A | * 3/1999 | Kman et al. | 29/739 |
| 6,225,566 B1 | * 5/2001 | Dienst | 174/138 E |
| 6,241,531 B1 | * 6/2001 | Roath et al. | 439/66 |
| 6,305,949 B1 | * 10/2001 | Okuyama et al. | 439/75 |
| 6,319,058 B1 | * 11/2001 | Jones | 439/567 |
| 6,333,855 B2 | * 12/2001 | Prabaonnaud et al. | 361/758 |
| 6,503,090 B2 | * 1/2003 | Onizuka | 439/75 |
| 6,543,098 B2 | * 4/2003 | Meyer et al. | 24/289 |
| 6,545,228 B2 | * 4/2003 | Hashimoto | 174/260 |
| 6,578,240 B2 | * 6/2003 | Fortenberry | 24/67 R |
| 6,773,268 B1 | * 8/2004 | Shipe et al. | 439/74 |

\* cited by examiner

UNIVERSAL SNAP-FIT SPACER

FIELD OF THE INVENTION

The present invention relates to the interconnection of circuit boards. In particular, the present invention relates to a universal snap-fit spacer system for stacking circuit boards, including circuit boards of different thicknesses.

BACKGROUND OF THE INVENTION

Electrical and electronic circuits are often formed on planar circuit boards. Often, it is desirable to interconnect two or more circuit boards to one another in a stacked configuration. When stacking multiple circuit boards, a minimum spacing must be maintained between a first circuit board and the circuit board or boards adjacent to the first circuit board. Such spacing is required for various reasons, including the prevention of electrical shorts between the boards, and the provision of cooling airflow over components interconnected to the circuit boards.

Systems for interconnecting circuit boards include threaded fasteners in combination with spacers. In such a system, a screw (or bolt) is passed through a hole formed in a first circuit board. Next, the spacer is placed over the screw, before the end of the screw is passed through a hole formed in a second circuit board. Finally, a nut is placed over the end of the threaded fastener to secure the assembly. Although a system of threaded fasteners in combination with spacers is capable of securely fastening a first circuit board to a second circuit board, such a system is not entirely satisfactory for a variety of reasons. For instance, considerable labor is involved in piecing together and securing the assembly, thus resulting in a relatively slow and expensive assembly process.

In addition, in order to interconnect a third circuit board using such a system, additional holes must be formed in either the first or second circuit board. This is disadvantageous, as space on individual circuit boards is often at a premium. In addition, the assembly of an electrical component having more than two interconnected circuit boards creates additional assembly difficulties, as access to the fasteners used to interconnect additional circuit boards is often limited. Alternatively, stacks of three or more circuit boards may be created by interposing interior circuit boards between two spacers, and using a screw that passes through all of the circuit boards. However, the assembly process for stacking three or more circuit boards in this manner is even more difficult than stacking a pair of circuit boards.

Another system for interconnecting multiple circuit boards involves the use of threaded spacer members in connection with threaded screws (or bolts). In such a system, the screw is placed through a hole formed in a first circuit board, and is then threaded into the threaded spacer. Next, a second screw or bolt is placed through a hole in the second circuit board, and is then threaded into the opposite end of the threaded spacer. Although such a system can decrease assembly times as compared to systems using spacers having smooth bores in combination with threaded fasteners, the threading of multiple components to one another is still required. Accordingly, the interconnection of multiple circuit boards using such a system remains relatively time consuming and expensive. In addition, such a system may also require the use of additional holes in circuit boards where more than two circuit boards are attached to one another.

Snap-fit, one piece interconnects have also been used for interconnecting circuit boards. Such one piece interconnects are capable of reducing the time required to interconnect multiple circuit boards. However, such one piece interconnects must be supplied in a variety of sizes, to accommodate different circuit board thicknesses and to accommodate different spacings between interconnected circuit boards. In addition, where more than two circuit boards are interconnected, interior circuit boards must have an additional set of holes formed therein, limiting the area of the circuit board available for electrical componentry For the reasons set forth above, there is a need for a method and apparatus for interconnecting multiple circuit boards quickly and inexpensively. In addition, there is a need for a method and apparatus that allows for more than two circuit boards to be interconnected that requires a minimal amount of circuit board area. There also is a need for a method and apparatus for interconnecting multiple circuit boards that is reliable in operation and inexpensive to implement.

SUMMARY OF THE INVENTION

The present invention is directed to solving these and other problems and disadvantages of the prior art. According to the present invention, a spacer element and a fastener member are provided for interconnecting multiple circuit boards. In operation, a first fastener member is used to interconnect a first circuit board to a spacer element. A second fastener member is then used to interconnect a second circuit board to the spacer element. The interconnections between the circuit board and the fastener member, and between the spacer element and the fastener member are made by a locking assembly provided on either end of the fastener member that allows the fastener member to be snapped together with the spacer element and with a circuit board or a second spacer element.

In accordance with an embodiment of the present invention, the locking assembly of the fastener member comprises a plurality of adjacent locking members interconnected to the body of the fastener member by a resilient portion. The resilient portion biases the locking members such that in a nominal position the distance between the outer edge of a first locking member and the outer edge of a second locking member adjacent to the first locking member is a first amount. When a force sufficient to overcome the biasing force is presented in a direction tending to draw adjacent locking members towards one another, the distance between the outer edge of the first locking member to the outer edge of the second locking member can be reduced to a second amount, that is less than the first amount.

In accordance with an embodiment of the present invention, the surface of the locking member proximate to the ends of the fastener member may be angled, to present a camming surface. Thus, when the fastener members are pressed into a hole having a diameter that is about equal to or slightly greater than the second distance, the locking members are pressed towards one another and the fastener can be inserted into the hole.

The biasing force provided by the resilient portion of the fastening member causes the distance between the outer edges of the locking members to return to the first or nominal amount after the locking members have passed through the hole, or have reached a recess in the interior of the spacer element. The surface of the locking members adjacent to the body portion of the fastener member may be perpendicular to the longitudinal axis of the fastening member, to form a locking surface that prevents the fastener member from being removed from the hole once the resilient members have returned the locking members to their nominal position. In a typical assemblage, a first fastener member is used to secure a first circuit board to a spacer element, while a second fastener member is used to interconnect a second circuit board to the spacer element.

In accordance with an embodiment of the present invention, the spacer element has an interior bore diameter about equal to the distance between the outer edges of the locking members when the locking members are compressed. Along the interior bore, multiple recesses may be formed. These recesses may be spaced at predetermined intervals, allowing a fastener member to be locked at varying depths within the spacer element.

According to still another embodiment of the present invention, depth control holes may be formed in the spacer element that intersect the interior bore and that are transverse to the longitudinal axis of the spacer element. Depth control rods may then be inserted in the depth control holes to prevent fastener members from being inserted into the spacer element further than the position of the depth control rod.

According to an embodiment of the present invention, multiple circuit boards may be interconnected to one another. In such an embodiment, a first fastener member is inserted into a hole formed in a first circuit board. A first end of the fastener member may be inserted into a first spacer element, and a second end of the fastener member may be inserted into a second spacer element such that the circuit board is held between the two spacer elements. A second circuit board may then be interconnected to the first spacer element by inserting a second fastener member into a hole in the second circuit board, and by inserting the second fastener member into an end of the first spacer element opposite the first fastener member. Similarly, a third circuit board may be stacked with the first two circuit boards by inserting a third fastener member through a hole in the third circuit board, and by inserting the third fastener member into an end of the second spacer element opposite the first fastener member.

According to yet another embodiment of the present invention, different thicknesses of circuit boards may be accommodated by a single fastener member and spacer element combination. For instance, a first circuit board thickness maybe accommodated by inserting the fastener member into the spacer element up to a first depth, while a second circuit board thickness may be accommodated by inserting the fastener member into the spacer element up to a second depth. According to still another embodiment of the present invention, spacer members may be used in combination with spacer elements to accommodate different circuit board thicknesses.

These and other advantages and features of the invention will become more apparent from the following description of illustrative embodiments of the invention, taken together with the drawings.

DETAILED DESCRIPTION

Figure 1:
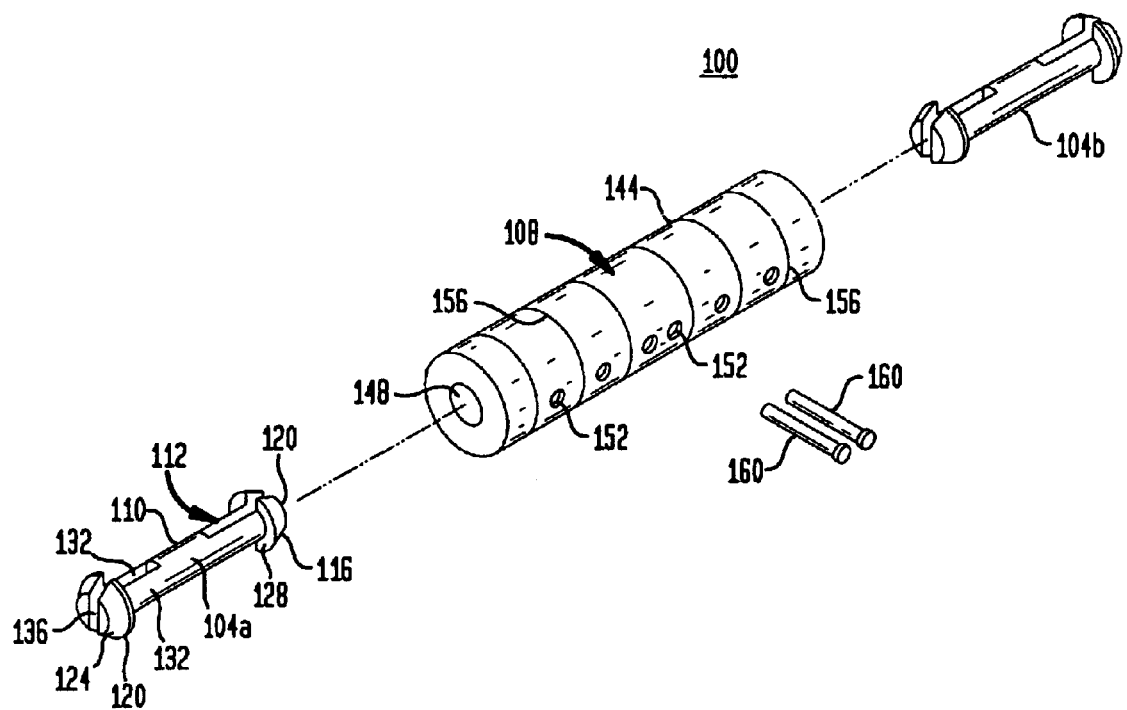
FIG. 1 is an exploded perspective view of a universal snap-fit spacer system in accordance with an embodiment of the present invention.

With reference now to FIG. 1, various components of a universal snap-fit spacer system 100 are illustrated. In general, the system 100 includes a fastener member 104 and a spacer element 108. In FIG. 1, two fastener members 104a and 104b are illustrated.

The fastener member 104 generally includes a body portion 110, and a resilient portion 112. A locking assembly 116 is interconnected to the body portion 110 of the fastener member 104 by the resilient portion 112. In the embodiment of the fastener member 104 illustrated in FIG. 1, a locking assembly 116 is formed at each end of the fastening member 104. According to the embodiment illustrated in FIG. 1, each locking assembly 116 includes a pair of locking members 120 that comprise a camming surface 124 and a locking surface 128. In general, the locking members 120 are interconnected to the body portion 110 of the fastener member 104 by a pair of stem members 132 that comprise the resilient portion 112. A gap 136 is formed between the stem members 132.

The spacer element 108 comprises a cylindrical member 144 with an interior bore 148 formed concentrically with the longitudinal axis of the cylindrical member 144. Depth control holes 152 are formed through the cylindrical member 144, such that they are transverse to the longitudinal axis of the cylindrical member 144 and intersect the interior bore 148. Exterior grooves 156 may be formed about the circumference of the cylindrical member 144 at predetermined intervals. Depth control rods 160, sized to be received by the depth control holes 152 may also be provided as part of the system 100. According to an embodiment of the present invention, the depth control rods are held in the depth control holes 152 by friction.

When no external force is applied to the locking assembly 116, the locking assembly 116 is in a first or nominal state. In this first state, the distance between the outer extent of a pair of locking surfaces 128 is a first, or maximum amount (e.g., as illustrated in FIG. 1). The distance across the outer extent of the locking surfaces 128 may be reduced to a second, minimal amount, by providing a force that brings the pair of locking members 120 together, closing the gap 136 at an end of the fastener member 104. In general, the edges of the camming surfaces 124 opposite the locking surfaces 128 present a maximum diameter that is less than the diameter of the bore 148. As the locking members 120 are pressed into the interior bore 148, the camming surfaces 124 force the locking members 120 together, across the gap 136. Thus, the gap 136 allows the maximum distance across the locking members 120 to be about equal to the diameter of the interior bore 148. Accordingly, the fastener member 104 is free to enter the spacer element 108. When a first recess, such as recess 208a (see FIG. 2B), is encountered, the biasing force provided by the resilient portion 112 causes the locking members 120b to return to their nominal position. In this nominal position, the locking members 120 present a maximum diameter, and the locking edge 140 of the locking members 120 is engaged with the latching surface 216 (see FIG. 2B) of the recess 208. Accordingly, the fastener member 104 is prevented from being withdrawn from the spacer element 108. If engagement with a next recess (e.g., recess 208b) is desired, the fastener member 104a can be pressed further into the spacer element 108. Forcing the fastener member 104 further into the spacer element 108 causes the tapered surface 212 of the recess 208 to act on the camming surface 124 of the locking members 120, bringing the locking members 120 closer together across the gap 136. Accordingly, it can be appreciated that the fastener member 104 can be moved further into the spacer element 108 to engage a next recess, but cannot be withdrawn from the interior bore 148 of the spacer element 108 after a first recess 208 has been engaged.

Figure 2A:
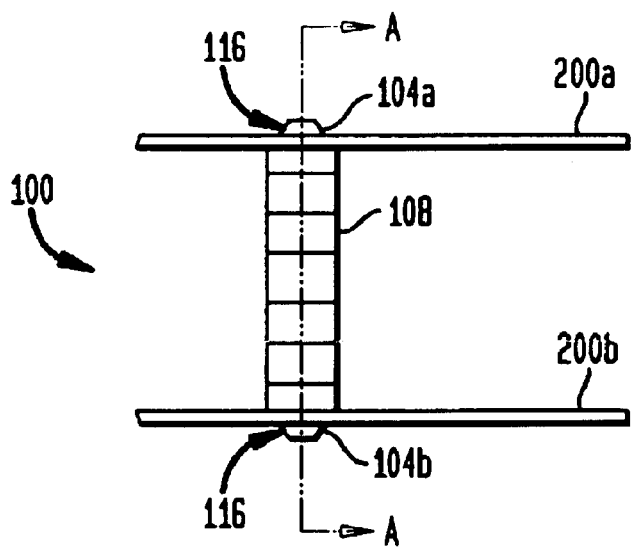
FIG. 2A is an elevational view of the universal snap-fit spacing system of FIG. 1 interconnecting first and second circuit boards.

With reference now to FIG. 2A, first 200a and second 200b circuit boards, held together by a snap-fit spacer system 100 in accordance with an embodiment of the present invention are illustrated. From FIG. 2A, it can be appreciated that the first circuit board 200a is held between the locking assembly 116 at an end of a first fastener member 104a and a first end of the spacer element 108. Furthermore, it is apparent that the second circuit board 200b is held between the locking assembly 116 at an end of a second fastener member 104b and the second end of the spacer element 108.

Figure 2B:
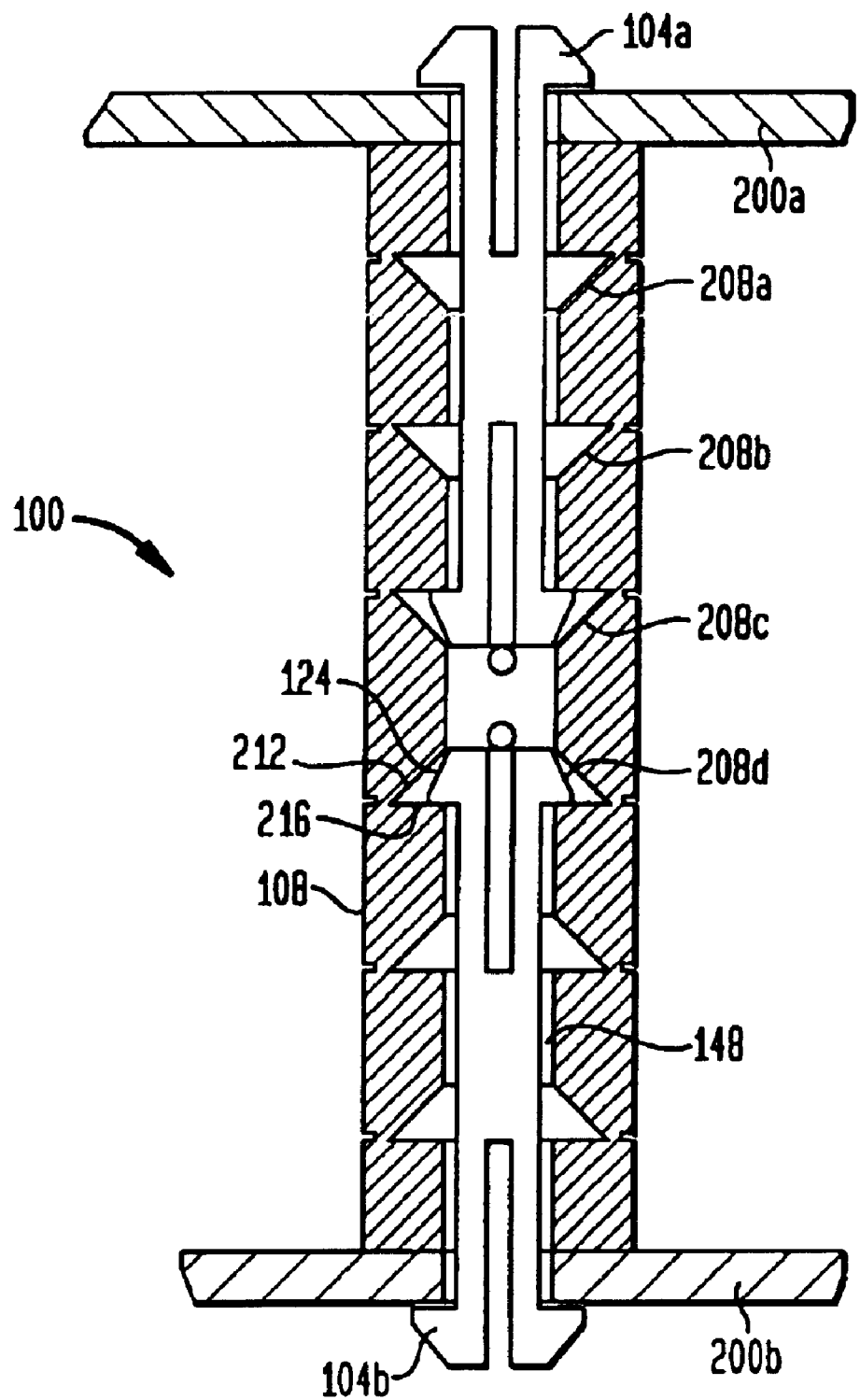
FIG. 2B is a cross-sectional view taken along section line A—A of FIG. 2A.

With reference now to FIG. 2B, the spacer system 100 and circuit boards 200a–b are shown in cross-section, the cross-section being taken along section line A—A in FIG. 2A. In FIG. 2B, the interior features of the spacer element 108 are clearly illustrated. In particular, annular recesses 208 formed within the interior bore 148b are visible. In general, the recesses 208 have a maximum diameter that is about equal to or greater than the maximum distance between the edges of the locking surfaces 128 when the locking assembly 116 is in the nominal position. As shown in FIG. 2B, the recesses 208 may include tapered surfaces 212 on a side of the recesses 208 proximal to the center of the spacer element 108 to assist the camming surfaces 124 in forcing the pair of locking members 120 towards one another, allowing the fastener members 104 to be pushed towards a recess 208 deeper within the interior bore 148. A latching surface 216 may be formed perpendicular to the longitudinal axis of the interior bore 148 and on a side of the recess proximal to the nearest end of the spacer element 108.

Figure 2C:
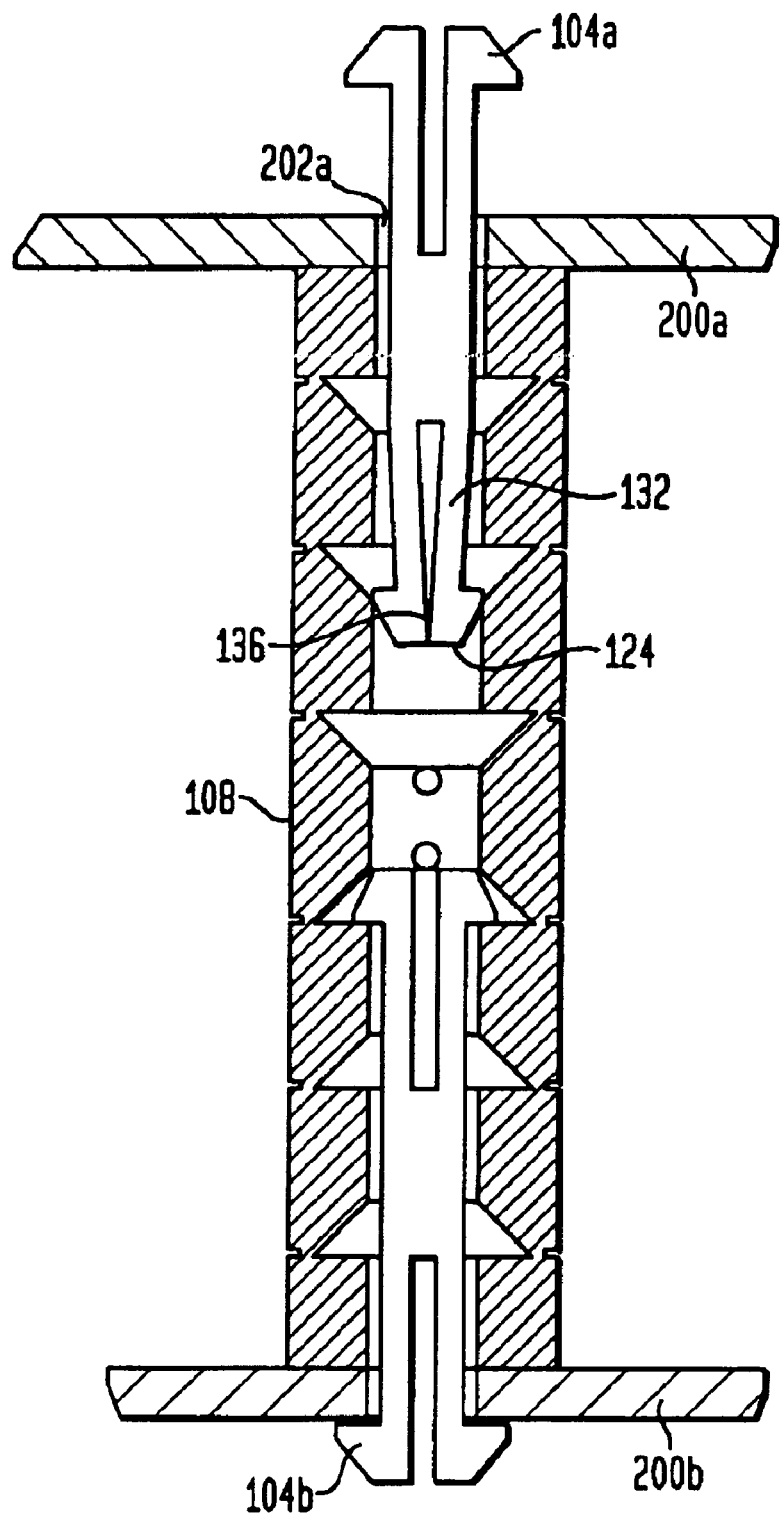
FIG. 2C is a cross-sectional view of the universal snap-fit spacing system of FIG. 1 with a fastener member partially inserted in a spacer element.

With reference now to FIG. 2C, a first fastener member 104a is shown being inserted into a spacer element 108. As illustrated in FIG. 2C, the camming surfaces 124 force the stem members 132 towards one another, closing or reducing the gap 136 at the end of the fastener member 104a as the fastener member is inserted into the hole 202a in the circuit board 200a or the interior bore 148 of the spacer element 108. With the stem members 132 forced together, the distance across the opposite locking surfaces 128 of the locking assembly 116 is reduced to an amount about equal to the diameter of the hole 202a or of the interior bore 148.

In FIG. 2B, the fastener members 104 are each shown with the locking surfaces 128 of a locking assembly 116 engaged with the latching surface 216 of recesses 208. Therefore, it is apparent that the locking assembly 116 at a first end of the first fastener member 104a was pushed past the first 208a and second 208b recesses before coming into engagement with the third recess 208c. It will further be noted that the locking surfaces 128 of the locking members 120 are engaged with the latching surface 216 of the third recess 208c. This engagement prevents the fastener member 104a from being withdrawn from the spacer element 108. Depth control rods 160a,b can be seen in position in depth control holes 152. The first depth control rod 160a prevents the first fastener member 104a from being pushed past the third recess 208c, and the second depth control rod 160b prevents the second fastener member 104b from being pushed past the fourth recess 208d.

At a second end of the first fastener member 104a, the locking assembly 116 can be seen in engagement with a surface of the first circuit board 200a. In particular, the locking surfaces 128 of the locking members 120 at the second end of the first fastener member 104a hold the first circuit board 200a against the first end of the spacer element 108. Likewise, at the second end of the spacer element 108, the second fastener member 104b affixes the second circuit board 200b against the spacer element 108. The locking members 120 at the first end of the second fastener member 104b can be seen in engagement with a fourth recess 208d. In order to position the locking members 120 of the first end of the second fastener member 104b in that recess 208d, fifth 208e and sixth 208f recesses were passed. In general, the recesses 208d,e, and f are the mirror images of 208a, b and c. In particular, the recesses 208d, e and f have tapered surfaces 212 oriented to cooperate with the camming surfaces 124 in reducing the effective diameter of the locking members 120 of fastener members 104 inserted into the second end of the spacer element 108, for example while the fastener member 104b is being brought into engagement with the fourth recess 208d, as explained above.

Figure 3A:
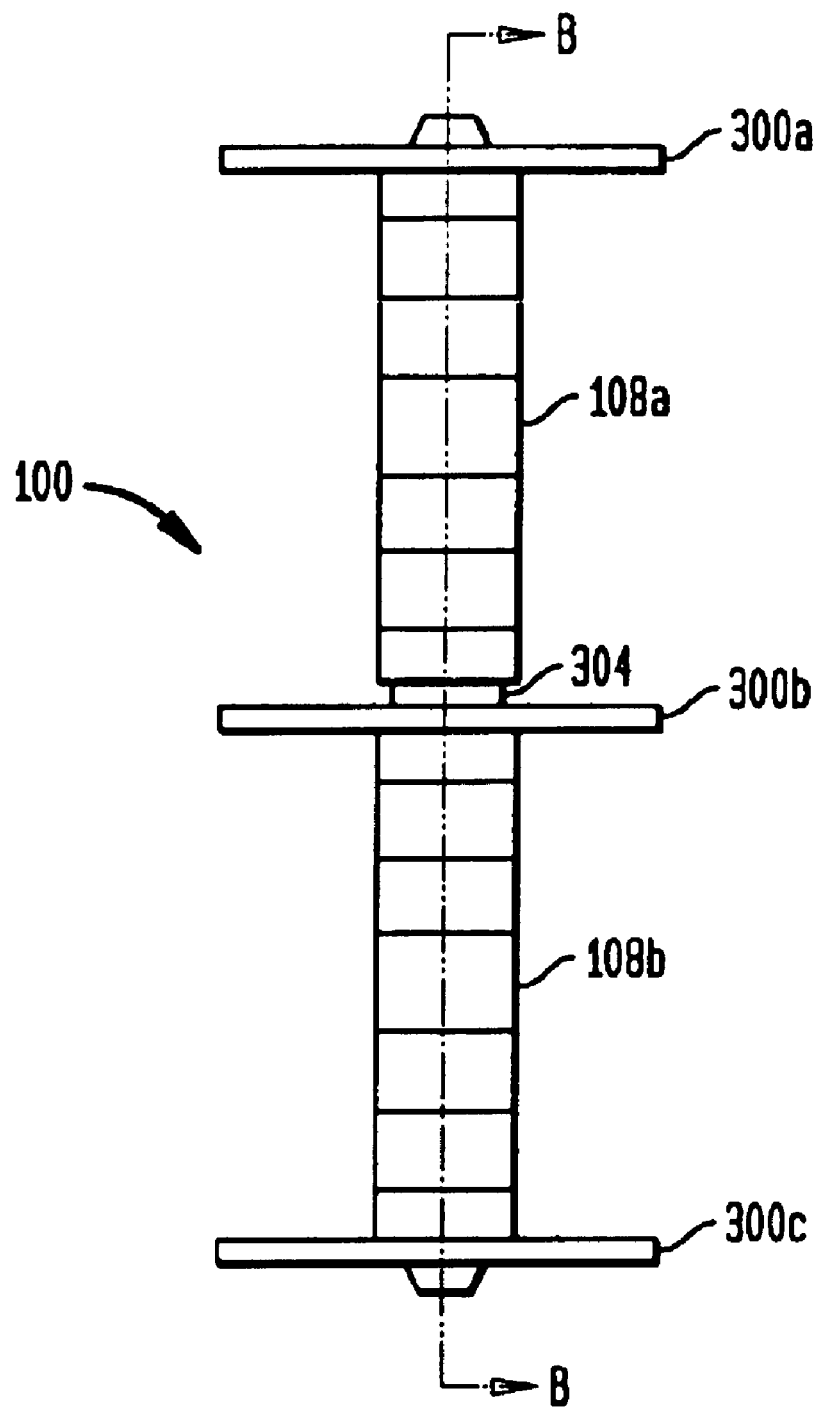
FIG. 3A is an elevational view of a universal snap-fit spacer system in accordance with an embodiment of the present invention, interconnecting first, second and third circuit boards.

With reference now to FIG. 3A, the fastening system 100 of the present invention is shown in an additional embodiment, interconnecting three circuit boards 300, 300a and 300b together in a stacked relationship. In particular, a first spacer element 108a is interposed between the first 300a and second 300b circuit boards, while a second spacer element 108b is interposed between the second 300b and third 300c circuit boards. In addition, a spacer member 304 is shown interposed between a second end of the first spacer element 108a and the second circuit board 300b.

Figure 3B:
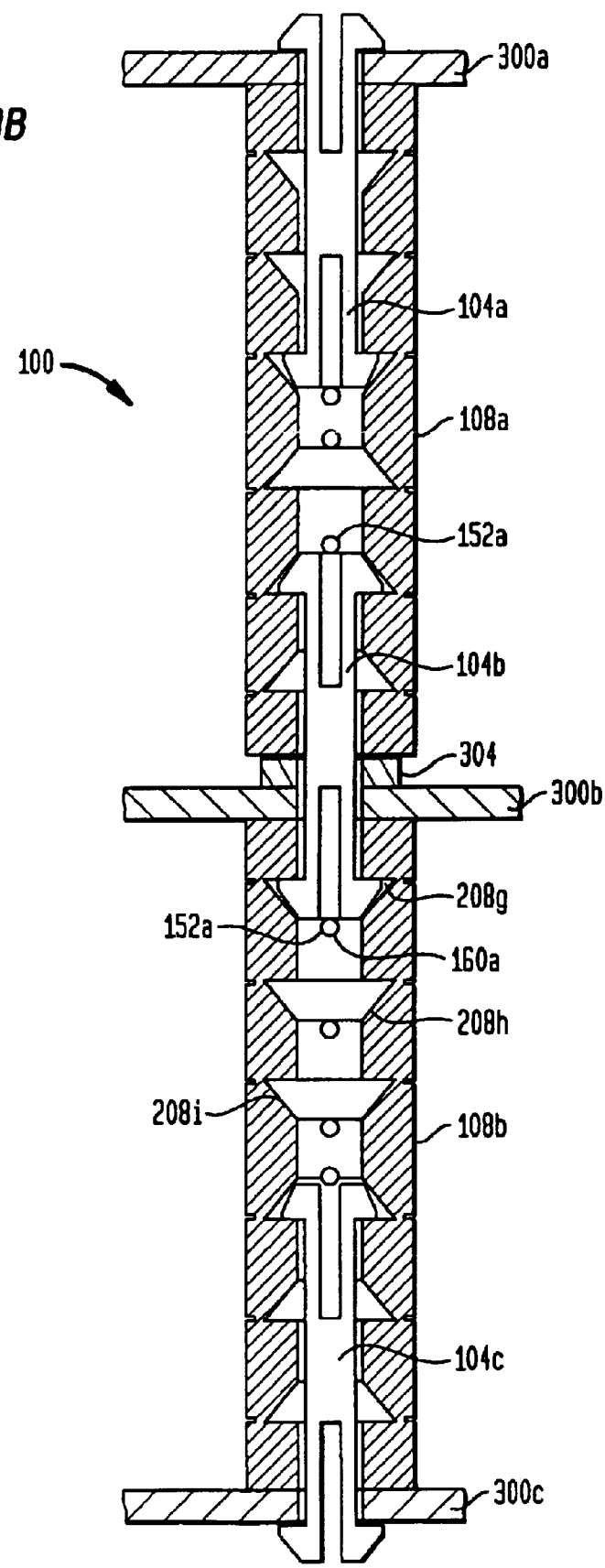
FIG. 3B is a cross-sectional view taken along section line B—B of FIG. 3A.

With reference to FIG. 3B, it can be appreciated that the depth control rod 160 inserted in the depth control hole 152a of the second spacer element 108b is useful to prevent the second fastener member 104b from passing the first recess 208g of the second spacer element 108b to engage a recess 208h or 208i deeper within the second spacer element 108b. Accordingly, the fastener member 104b can be inserted in the second spacer element 108b, through the second circuit board 300b, through the spacer member 304, and in the first spacer element 108a, without causing the second fastener member 104b to travel too deeply into the second spacer element 108b. Furthermore, it can be appreciated that if a depth control rod 160 is inserted in the depth control hole 152a of the first spacer element 108a, the order of assembly of the interconnection between the first 108a and second 108b spacer elements, the second circuit board 304 and the spacer member 312 is not important. Without a depth control rod in the depth control hole 152a of the first spacer element, the second fastener member should first be inserted in the second spacer element 108b, through the circuit board 300b, through the spacer member 304, and finally inserted in the first spacer element 108a.

Figure 4A:
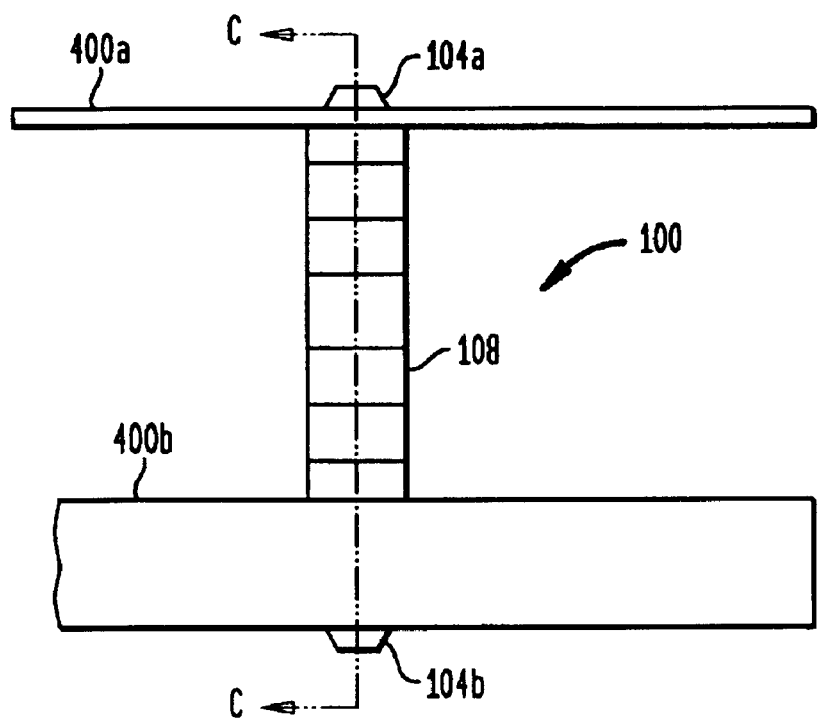
FIG. 4A is an elevational view of a universal snap-fit spacer system in accordance with an embodiment of the present invention, interconnecting a first circuit board having a first thickness and a second circuit board having a second thickness.

With reference now to FIG. 4A, the fastening system 100 of the present invention is shown in yet another embodiment, interconnecting a first circuit board 400a having a first thickness, to a second circuit board 400b having a second thickness.

Figure 4B:
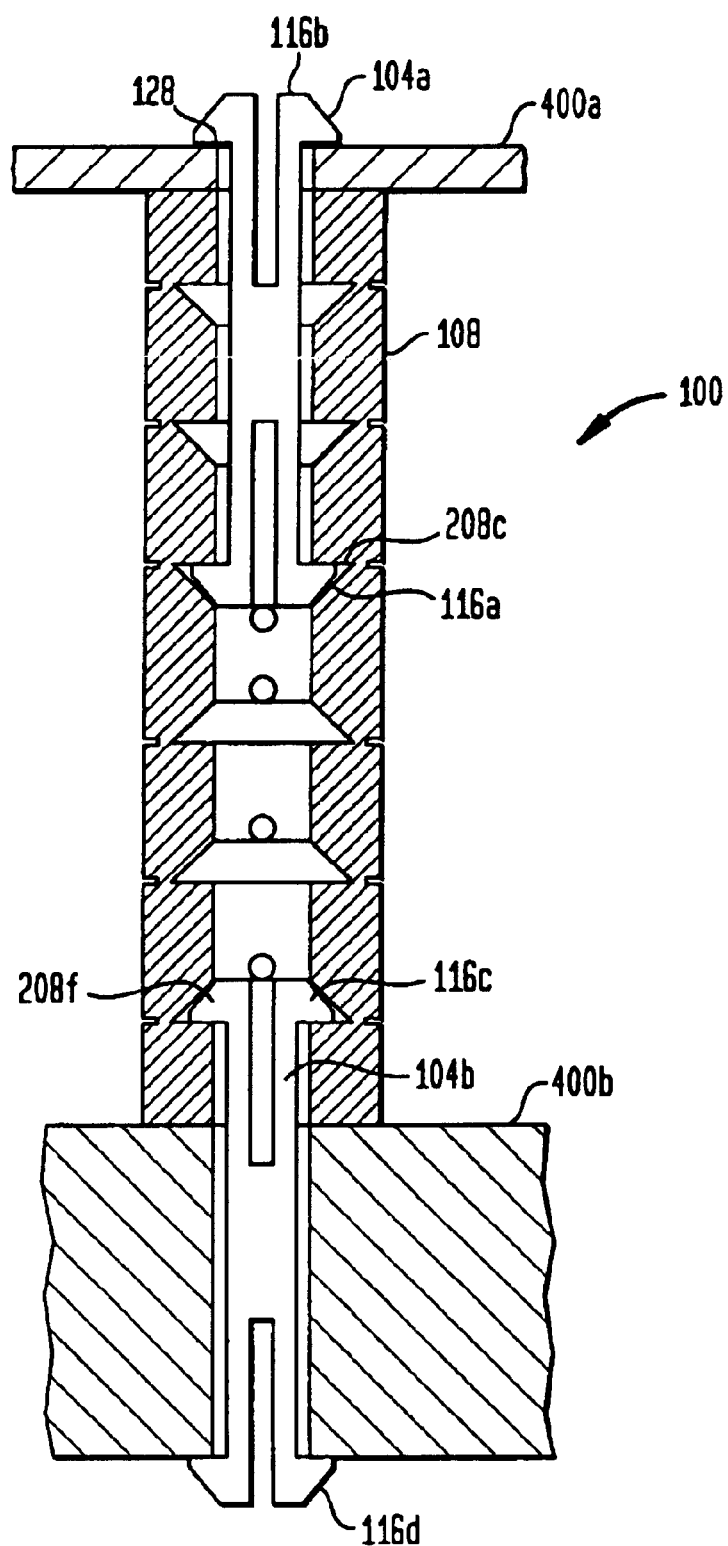
FIG. 4B is a cross-sectional view taken along section line C—C of FIG. 4A.

With reference now to FIG. 4B, the fastening system 100 illustrated in FIG. 4A is shown in a cross-sectional view taken along section line C—C. In FIG. 4B, the first fastening member 104a can be seen with a first locking assembly 116a engaged with the third recess 208c of the spacer element 108. This configuration allows the second locking assembly 116b to hold the first circuit board 400a between the locking surfaces 128 of the second locking assembly 116b and the first end of the spacer element 108. The second fastener member 104b can be seen with a first locking assembly 116c engaged with a sixth recess 208f. The locking assembly 116d at a second end of the second fastener member 104b holds the second circuit board 400b against the second end of the spacer element 108. Accordingly, as illustrated in FIG. 4B, by engaging different recesses 208, along the interior bore 148 of the spacer element 108 with a locking assembly 116 of a fastener member 104, the system 100 of the present invention is capable of interconnecting circuit boards 400 of different thicknesses to one another in a stacked relationship.

As an illustration of how the fastener members 104 and spacer elements 108 may be dimensioned in a system 100, the following is provided as an example. However, it should be appreciated that other spacings and relationships may be used. In general, fastener members 104 and spacer elements 108 should be dimensioned to accommodate the thickness of circuit boards that the system 100 is likely to be used to interconnect. According to this example, the recesses 208 adopted for receiving the locking members 120 of a fastener member 104 inserted in an end of a spacer element 108 are spaced apart from one another by a distance x. The distance from an end of the spacer element 108 to the latching surface 216 of the recess 208 nearest that end of the spacer element 108 is equal to x less the thickness of the thickest circuit board of those circuit boards having a thickness y that is less than x adapted for interconnection using the system 100. Furthermore, the distance between the locking surfaces 128 of opposite locking assemblies or a fastener member 104 is equal to 3 x. Accordingly, as shown in FIG. 1B, a circuit board having a thickness y at an end of a stack of circuit boards, can be interconnected to a spacer element 108 by inserting a fastener member 104 through a hole in the circuit board into the interior bore 148 of the spacer element 108 such that the third recess (e.g., recess 208c) is engaged by the locking members 120 at a first end of the fastener member 104. As a further example, as shown in FIG. 4B, a circuit board 400b having a thickness equal to y+2x can be interconnected to another circuit board 400a using a fastener member 104b inserted through the second circuit board 400b and engaged with the sixth recess 208f.

Where a circuit board is to be stacked such that it is positioned between two other circuit boards, as illustrated in FIGS. 3A and 3B, a spacer member 304 having a thickness y is provided such that the distance between recesses at the second end of the first spacer element 108a is an integer multiple of the distance x from the recesses at the first end of the second spacer element 108b.

If a spacer element 108 having a shorter length is desired, it can be cut at a groove 156. Each groove 156 is positioned so that it lies in or near a plane that includes a latching surface 216 of a recess 208.

In accordance with an embodiment of the present invention, the components (e.g., fastener member 104, spacer element 108 and depth control rods 160) are formed from nonconductive materials. For example, the components of the present invention may be formed from nylon, polypropylene or plastic. In accordance with yet another embodiment of the present invention, only the spacer element 108 is formed from non-conductive materials. Where the conduction of electricity between interconnected circuit boards is not a required or desired characteristic, the spacer element 108 may be formed from a conductive material.

Although the above description discusses the interconnection of circuit boards, the invention is not so limited. For example, the present invention may be utilized whenever a flexible system for quickly interconnecting components is desired. In addition, it should be appreciated that the present invention may be used to interconnect circuit boards to assemblies or components other than additional circuit boards. For example, the present invention may be used to interconnect a circuit board to an enclosure.

The foregoing discussion of the invention has been presented for purposes of illustration and description. Further, the description is not intended to limit the invention to the form disclosed herein. Consequently, variations and modifications commensurate with the above teachings, within the skill and knowledge of the relevant art, are within the scope of the present invention. The embodiments described hereinabove are further intended to explain the best mode presently known of practicing the invention and to enable others skilled in the art to utilize the invention in such or in other embodiments and with various modifications required by their particular application or use of the invention. It is intended that the appended claims be construed to include the alternative embodiments to the extent permitted by the prior art.

What is claimed is:

1. A universal snap-fit spacer system, comprising:
    a fastener member, comprising:
        a body portion;
        at least two resilient portions, wherein said resilient portions comprise stem members, and wherein said fastener member further comprises a gap formed between said stem members; and
        a locking assembly, wherein said resilient portion biases said locking assembly into a first position;
    a spacer element, comprising:
        an interior bore;
        a plurality of recesses formed in said interior bore, wherein said locking assembly of said fastener member may be received in any one of a number of said plurality of recesses to prevent said fastener member from being withdrawn from said spacer element.

2. The system of claim 1, wherein said locking assembly is in said first position when said locking assembly is received in one of said plurality of recesses.

3. The system of claim 1, wherein in said first position a distance across said locking assembly is equal to a first amount.

4. The system of claim 1, wherein in a second position a distance across said locking assembly is equal to a second amount, and wherein said second amount is about equal to a diameter of said interior bore.

5. The system of claim 1, wherein said locking assembly comprises:
    at least a first camming surface; and
    at least a first locking surface.

6. The system of claim 1, wherein at least a first recess comprises:
a tapered surface; and
a latching surface.

7. The system of claim 6, wherein a latching surface of a first of said recesses is a first distance from a latching surface of a second of said recesses, wherein said fastener member comprises a pair of locking assemblies, and wherein a distance between a locking surface of a first of said locking assemblies and a locking surface of a second of said locking assemblies is a distance equal to an integer multiple of said first distance.

8. The system of claim 1, wherein said spacer element further comprises a plurality of grooves formed in an exterior of said spacer element, and wherein at least a first of said grooves is formed in a plane corresponding to a plane of a latching surface of one of said recesses.

9. The system of claim 1, wherein said spacer element further comprises a plurality of depth control holes, wherein a depth control rod can be inserted in one of said depth control holes to prevent the fastener member from being inserted into said spacer element past a predetermined depth.

10. The system of claim 1, wherein said plurality of recesses are axially aligned with one another.

11. A method for interconnecting objects, comprising:
interconnecting a first snap fit fastener member to a first object, wherein said first snap fit fastener member has substantially identical first and second ends;
interconnecting said first snap fit fastener member to a spacer element;
interconnecting a second snap fit fastener member to a second object, wherein said second snap fit fastener member has substantially identical first and second ends;
interconnecting said second snap fit fastener member to said spacer element, wherein said first and second objects are fastened to one another, wherein each of said first and second objects are in contact with said spacer element, and wherein said first snap fit fastener member is substantially identical to said second snap fit fastener member.

12. The method of claim 11, further comprising:
interconnecting said second snap fit fastener member to a second spacer element;
interconnecting a third snap fit fastener member to a third object;
interconnecting said third snap fit fastener member to said second spacer element, wherein said first, second, and third objects are fastened to one another.

13. The method of claim 11, wherein said first and second objects comprise first and second circuit boards respectively.

14. The method of claim 13, wherein said first circuit board is a first thickness, and wherein said second circuit board is a second thickness.

15. The method of claim 11, wherein said spacer element comprises a plurality of recesses, wherein said fastener members comprise at least a first fastener assembly, wherein said first fastener member engages a recess at a first distance from a first end of said spacer element.

16. The method of claim 15, wherein said second member engages a recess at a second distance from a second end of said spacer element, and wherein said first and second objects are different thicknesses.

17. A system for stacking circuit boards, comprising:
a first fastener member;
a first spacer element comprising an interior bore and a plurality of interior recesses;
a first circuit board, wherein a first locking assembly at a first end of said first fastener member is snap fit to said first circuit board and a second locking assembly at a second end of said first fastener member is snap fit to said first spacer element, wherein said first circuit board is held between said first locking assembly of said first fastener member and a first end of said spacer element;
a second fastener member;
a second circuit board, wherein a first locking assembly at a first end of said second fastener member is snap fit to said first circuit board and a second locking assembly at a second end of said second fastener member is snap fit to said first spacer element, and wherein said second circuit board is in a stacked relationship with said second circuit board.

18. The system of claim 17, wherein said first circuit board is a first thickness, and wherein said second locking assembly at a second end of said first fastener member is engaged with a first recess of said first spacer element located a first distance from said first end of said first spacer element.

19. The system of claim 18, wherein said second circuit board is a second thickness, and wherein said second locking assembly at a second end of said second fastener member is engaged with a second recess of said first spacer element located a second distance from said second end of said first spacer element.

20. The system of claim 17, wherein said second circuit board is held between said first looking assembly of said second fastener member and a second end of said first spacer element.

21. The system of claim 17, further comprising:
a second spacer element, wherein said second locking assembly at a second end of said second fastener member is snap fit to said second spacer element, wherein said second circuit board is held between a second end of said first spacer element and a first end of said second spacer element;
a third fastener member;
a third circuit board, wherein a first locking assembly at a first end of said third fastener member is snap fit to said third circuit board and a second locking assembly at a second end of said third fastener member is snap fit to said second spacer element, wherein said third circuit board is held between said first locking assembly of said third fastener member and a second end of said second spacer element.

* * * * *